United States Patent
Holden et al.

(10) Patent No.: US 10,112,259 B2
(45) Date of Patent: Oct. 30, 2018

(54) DAMAGE ISOLATION BY SHAPED BEAM DELIVERY IN LASER SCRIBING PROCESS

(71) Applicant: APPLIED MATERIALS, INC., Santa Clara, CA (US)

(72) Inventors: James M. Holden, San Jose, CA (US); Nir Merry, Mountain View, CA (US); Todd Egan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 545 days.

(21) Appl. No.: 14/684,290

(22) Filed: Apr. 10, 2015

(65) Prior Publication Data

US 2015/0217401 A1    Aug. 6, 2015

Related U.S. Application Data

(62) Division of application No. 13/161,424, filed on Jun. 15, 2011, now Pat. No. 9,029,242.

(51) Int. Cl.
*B23K 26/06* (2014.01)
*B23K 26/00* (2014.01)
(Continued)

(52) U.S. Cl.
CPC ...... *B23K 26/0635* (2013.01); *B23K 26/0624* (2015.10); *B23K 26/364* (2015.10);
(Continued)

(58) Field of Classification Search
CPC .......... B23K 2203/172; B23K 2203/42; B23K 2203/50; B23K 26/0624; B23K 26/0635;
(Continued)

(56) References Cited

U.S. PATENT DOCUMENTS

| 4,049,944 A | 9/1977 | Garvin et al. |
| 4,339,528 A | 7/1982 | Goldman |

(Continued)

FOREIGN PATENT DOCUMENTS

| JP | 9216085 | 8/1997 |
| JP | 10321908 | 12/1998 |

(Continued)

OTHER PUBLICATIONS

Addae-Mensah et al., "Poly(vinyl alcohol) as a structure release layer for the microfabrication of polymer composite structures", IOP Publishing. Journal of Micromechanics and Microengineering, 17 (2007), pp. N41-N46.

(Continued)

*Primary Examiner* — Dana Ross
*Assistant Examiner* — James Sims, III
(74) *Attorney, Agent, or Firm* — Schwabe, Williamson & Wyatt, P.C.

(57) ABSTRACT

Methods and apparatuses for dicing substrates by both laser scribing and plasma etching. A method includes laser ablating material layers, the ablating by a laser beam with a centrally peaked spatial power profile to form an ablated trench in the substrate below thin film device layers which is positively sloped. In an embodiment, a femtosecond laser forms a positively sloped ablation profile which facilitates vertically-oriented propagation of microcracks in the substrate at the ablated trench bottom. With minimal lateral runout of microcracks, a subsequent anisotropic plasma etch removes the microcracks for a cleanly singulated chip with good reliability.

11 Claims, 11 Drawing Sheets

(51) Int. Cl.
*B23K 26/36* (2014.01)
*H01L 21/67* (2006.01)
*H01J 37/32* (2006.01)
*H01L 21/3065* (2006.01)
*H01L 21/78* (2006.01)
*B23K 26/364* (2014.01)
*B23K 26/0622* (2014.01)
*B23K 26/40* (2014.01)
*B23K 103/16* (2006.01)
*B23K 103/00* (2006.01)

(52) U.S. Cl.
CPC ........ *B23K 26/40* (2013.01); *H01J 37/32889* (2013.01); *H01L 21/30655* (2013.01); *H01L 21/67069* (2013.01); *H01L 21/67196* (2013.01); *H01L 21/67207* (2013.01); *H01L 21/78* (2013.01); *B23K 2203/172* (2015.10); *B23K 2203/42* (2015.10); *B23K 2203/50* (2015.10); *H01J 2237/332* (2013.01); *H01J 2237/334* (2013.01)

(58) Field of Classification Search
CPC . B23K 26/364; B23K 26/40; H01J 2237/332; H01J 2237/334; H01J 37/32889; H01L 21/30655; H01L 21/67069; H01L 21/67196; H01L 21/67207; H01L 31/18; H05H 1/24; H05H 1/26
USPC .......... 118/698; 156/345.24, 345.31, 345.32; 438/471
See application file for complete search history.

(56) References Cited

U.S. PATENT DOCUMENTS

| | | | |
|---|---|---|---|
| 5,336,638 A | 8/1994 | Suzuki et al. |
| 5,593,606 A | 1/1997 | Owen et al. |
| 5,684,437 A | 11/1997 | Ago et al. |
| 5,691,794 A | 11/1997 | Hoshi et al. |
| 6,051,503 A | 4/2000 | Bhardwaj et al. |
| 6,057,180 A | 5/2000 | Sun et al. |
| 6,117,347 A | 9/2000 | Ishida |
| 6,174,271 B1 | 1/2001 | Kosmowski |
| 6,300,593 B1 | 10/2001 | Powell |
| 6,306,731 B1 | 10/2001 | Igarashi et al. |
| 6,407,363 B2 | 6/2002 | Dunsky et al. |
| 6,426,275 B1 | 7/2002 | Arisa |
| 6,465,158 B1 | 10/2002 | Sekiya |
| 6,528,864 B1 | 3/2003 | Arai |
| 6,568,899 B1 * | 5/2003 | Kuribayashi ..... H01L 21/67766 414/805 |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,361,990 B2 | 4/2008 | Lu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 | 3/2009 | Mancini et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,804,043 B2 | 9/2010 | Deshi |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,926,410 B2 | 4/2011 | Bair |
| 7,927,973 B2 | 4/2011 | Haji et al. |
| 2001/0035401 A1 | 11/2001 | Manor |
| 2002/0012345 A1 | 1/2002 | Kalkunte et al. |
| 2002/0042189 A1 | 4/2002 | Tanaka |
| 2003/0045101 A1 | 3/2003 | Flanner et al. |
| 2003/0152756 A1 | 8/2003 | Yamada et al. |
| 2003/0162313 A1 | 8/2003 | Kim et al. |
| 2004/0080045 A1 | 4/2004 | Kimura et al. |
| 2004/0137700 A1 | 7/2004 | Sekiya |
| 2004/0157457 A1 | 8/2004 | Xu et al. |
| 2004/0212047 A1 | 10/2004 | Joshi et al. |
| 2004/0259329 A1 | 12/2004 | Boyle et al. |
| 2006/0024924 A1 | 2/2006 | Haji et al. |
| 2006/0043535 A1 | 3/2006 | Hiatt |
| 2006/0086898 A1 | 4/2006 | Cheng et al. |
| 2006/0088984 A1 | 4/2006 | Li et al. |
| 2006/0146910 A1 | 7/2006 | Koochesfahani et al. |
| 2006/0191865 A1 * | 8/2006 | Nishimura ........ H01L 21/31055 216/58 |
| 2006/0205182 A1 | 9/2006 | Soejima |
| 2007/0272555 A1 | 11/2007 | Baird |
| 2007/0272666 A1 | 11/2007 | O'Brien et al. |
| 2008/0191121 A1 * | 8/2008 | Yoo ........ G02B 26/101 250/201.4 |
| 2008/0283848 A1 | 11/2008 | Yamazaki |
| 2009/0176375 A1 | 7/2009 | Benson et al. |
| 2009/0255901 A1 | 10/2009 | Krishnaswami et al. |
| 2009/0321748 A1 | 12/2009 | Lee |
| 2010/0013036 A1 | 1/2010 | Carey |
| 2010/0025387 A1 | 2/2010 | Arai et al. |
| 2010/0048001 A1 | 2/2010 | Harikai et al. |
| 2010/0120227 A1 | 5/2010 | Grivna et al. |
| 2010/0120230 A1 | 5/2010 | Grivna et al. |
| 2010/0246611 A1 | 9/2010 | Sun |
| 2010/0248451 A1 | 9/2010 | Pirogovsky et al. |
| 2011/0029124 A1 | 2/2011 | Boyle et al. |
| 2011/0309233 A1 * | 12/2011 | Seo ........ B82Y 20/00 250/208.1 |
| 2013/0045554 A1 | 2/2013 | Yamazaki |
| 2013/0065378 A1 | 3/2013 | Johnson et al. |
| 2013/0230972 A1 | 9/2013 | Johnson et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| JP | 2007281526 | 10/2007 |
| JP | 2009034694 | 2/2009 |
| JP | 2010165963 | 7/2010 |
| KR | 20100020727 | 2/2010 |
| WO | WO-03036712 | 5/2003 |
| WO | WO-03071591 | 5/2003 |
| WO | WO-2011163149 | 12/2011 |
| WO | WO-2012173758 | 12/2012 |
| WO | WO-2012173759 | 12/2012 |

(56) References Cited

FOREIGN PATENT DOCUMENTS

| WO | WO-2012173768 | 12/2012 |
|---|---|---|
| WO | WO-2012173770 | 12/2012 |

OTHER PUBLICATIONS

Linder, et al., "Water-Soluble Sacrificial Layers for Surface Micromachining", www.small-journal.com, 2005, 1, No. 7, 7 Pages.

Singh, et al., "Apparatus and Methods for Dry Etch With Edge, Side and Back Protection", U.S. Appl. No. 61/491,693, filed May 31, 2011 24 pgs.

Restriction Requirement for U.S. Appl. No. 13/180,336 dated Sep. 11, 2012, 6 pages.

International Search Report and Written Opinion from PCT/US2012/040303 dated Dec. 28, 2012, 9 pgs.

Restriction Requirement for U.S. Appl. No. 13/161,006 dated Jan. 10, 2013, 6 Pages.

International Search Report and Written Opinion for PCT Patent Application No. PCT/US2012/040295 dated Dec. 27, 2012, 11 Pages.

Restriction Requirement for U.S. Appl. No. 13/161,026 dated Jan. 17, 2013, 6 Pages.

International Search Report and Written Opinion from PCT/US2012/040307 dated Dec. 28, 2012, 9 pgs.

International Search Report and Written Opinion for PCT Patent Application No. PCT/US2012/039746 dated Dec. 26, 2012, 10 Pages.

Restriction Requirement for U.S. Appl. No. 13/161,036 dated Feb. 1, 2013, 6 Pages.

Restriction Requirement for U.S. Appl. No. 13/160,973 dated Jan. 9, 2013, 6 Pages.

International Search Report and Written Opinion for PCT Patent Application No. PCT/US2012/039207 dated Dec. 26, 2012, 12 Pages.

International Search Report and Written Opinion for PCT Patent Application No. PCT/US2012/039209 dated Dec. 26, 2012, 8 Pages.

International Search Report and Written Opinion for PCT Patent Application No. PCT/US2012/039205 dated Dec. 26, 2012, 11 Pages.

International Search Report and Written Opinion for PCT Patent Application No. PCT/US2012/039753 dated Dec. 26, 2012, 9 Pages.

International Search Report and Written Opinion for PCT Patent Application No. PCT/US2012/040289 dated Jan. 2, 2013, 11 Pages.

International Search Report and Written Opinion for PCT Patent Application No. PCT/US2011/041126 dated Feb. 21, 2012, 10 Pages.

International Preliminary Report on Patentability for PCT Patent Application No. PCT/US2011/041126 dated Jan. 10, 2013, 7 Pages.

Restriction Requirement for U.S. Appl. No. 13/161,045 dated Feb. 19, 2013, 5 Pages.

Van Borkulo, Jeroen et al., "Enabling Technology in Thin Wafer Dicing", The Electrochemical Society, vol. 18, Issue 1, Packaging Technology, 2009, pp. 837-842.

Non-Final Office Action for U.S. Appl. No. 13/180,336 dated Feb. 6, 2013, 15 Pages.

\* cited by examiner

DAMAGE ISOLATION BY SHAPED BEAM DELIVERY IN LASER SCRIBING PROCESS

This application is a Divisional Application of application Ser. No. 13/161,424 filed Jun. 15, 2011 which is hereby incorporated by reference.

TECHNICAL FIELD

Embodiments of the present invention pertain to the field of semiconductor processing and, in particular, to methods for dicing substrates, each substrate having an integrated circuit (IC) thereon.

BACKGROUND DESCRIPTION OF RELATED ART

In semiconductor substrate processing, ICs are formed on a substrate (also referred to as a wafer), typically composed of silicon or other semiconductor material. In general, thin film layers of various materials which are either semiconducting, conducting or insulating are utilized to form the ICs. These materials are doped, deposited and etched using various well-known processes to simultaneously form a plurality of ICs, such as memory devices, logic devices, photovoltaic devices, etc, in parallel on a same substrate.

Following device formation, the substrate is mounted on a supporting member such as an adhesive film stretched across a film frame and the substrate is "diced" to separate each individual device or "die" from one another for packaging, etc. Currently, the two most popular dicing techniques are scribing and sawing. For scribing, a diamond tipped scribe is moved across a substrate surface along pre-formed scribe lines. Upon the application of pressure, such as with a roller, the substrate separates along the scribe lines. For sawing, a diamond tipped saw cuts the substrate along the streets. For thin substrate singulation, such as <150 μms (μm) thick bulk silicon singulation, the conventional approaches have yielded only poor process quality. Some of the challenges that may be faced when singulating die from thin substrates may include microcrack formation or delamination between different layers, chipping of inorganic dielectric layers, retention of strict kerf width control, or precise ablation depth control.

While plasma dicing has also been contemplated, a standard lithography operation for patterning resist may render implementation cost prohibitive. Another limitation possibly hampering implementation of plasma dicing is that plasma processing of commonly encountered interconnect metals (e.g., copper) in dicing along streets can create production issues or throughput limits. For example microcracks formed during the laser scribing process may remain following a plasma etch.

SUMMARY

Embodiments of the present invention include methods of laser scribing substrates. In the exemplary embodiment, the laser scribing is implemented with a laser beam having a centrally peaked spatial power profile to form a sloped ablated sidewall in a substrate.

In an embodiment, a method of dicing a semiconductor substrate having a plurality of ICs includes receiving a masked semiconductor substrate, the mask covering and protecting ICs on the substrate. The masked substrate is ablated along streets between the ICs with a laser beam having a centrally peaked spatial power profile. In one embodiment, a center portion of the mask thickness and a thin film device thickness in the street is ablated through to provide a patterned mask with a positively sloped profile. A portion of the substrate ablated by the laser also has a positively sloped profile along a plane substantially perpendicular to the direction of laser travel. Sloped sidewall of the substrate are etched with an anisotropic deep trench etch process to singulate the dice and remove microcracks in the substrate generated during laser scribe.

In another embodiment, a system for dicing a semiconductor substrate includes a laser scribe module and a plasma etch chamber, integrated onto a same platform. The laser scribe module is to ablate material with a laser beam having a centrally peaked spatial power profile and the plasma chamber is to etch through the substrate and singulate the IC chips in a manner which removes microcracks in the substrate generated by the laser ablation. The laser scribe module may include a beam shaper to provide the centrally peaked spatial power profile.

BRIEF DESCRIPTION OF THE DRAWINGS

Embodiments of the present invention are illustrated by way of example, and not limitation, in the figures of the accompanying drawings in which.

DETAILED DESCRIPTION

Figure 1A:
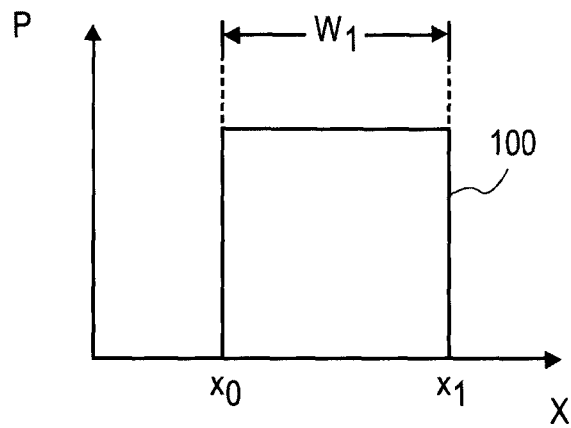
FIG. 1A is a graph illustrating a top hat laser beam spatial profile.

Methods of dicing substrates, each substrate having a plurality of ICs thereon, are described. In the following description, numerous specific details are set forth, such as femtosecond laser scribing and deep silicon plasma etching conditions in order to describe exemplary embodiments of the present invention. However, it will be apparent to one skilled in the art that embodiments of the present invention may be practiced without these specific details. In other instances, well-known aspects, such as IC fabrication, substrate thinning, taping, etc., are not described in detail to avoid unnecessarily obscuring embodiments of the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the Figures are merely illustrative representations and are not necessarily drawn to scale.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other material layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Generally, described herein is a laser scribe process employing a laser having a beam with a centrally peaked and sloped spatial power profile to ablate a predetermined path through an unpatterned (i.e., blanket) mask layer, a passivation layer, and subsurface thin film device layers. The laser scribe process may then be terminated upon exposure of, or partial ablation of, the substrate. Any ablation of the substrate by the peaked beam profile will tend to advantageously form positively sloped substrate sidewalls. In accordance with an embodiment of the present invention, the peaked spatial profile is provided in a femtosecond laser. Femtosecond laser scribing is an essentially, if not completely, non-equilibrium process. For example, the femtosecond-based laser scribing may be localized with a negligible thermal damage zone. In an embodiment, femtosecond laser scribing is used to singulate ICs having ultra-low κ films (i.e., with a dielectric constant below 3.0). In one embodiment, direct writing with a laser eliminates a lithography patterning operation, allowing the masking material to be something other than a photo resist as is used in photolithography. In the exemplary hybrid dicing embodiment, the laser scribing process is followed by a plasma etch through the bulk of the substrate which removes most or all of the microcracks in the substrate generated by the laser ablation. In one such embodiment, a substantially anisotropic etching is used to complete the dicing process in a plasma etch chamber; the anisotropic etch achieving a high directionality into the substrate by depositing on sidewalls of the etched trench an etch polymer.

FIG. 1A is a graph illustrating a top hat laser beam spatial profile 100 which provides a substantially flat power level (P) across a beam width $W_1$ along at least the direction x, which is in a direction substantially perpendicular to a direction of laser beam travel relative to the substrate. The top hat beam spatial profile 100 is typically the same in the direction y (direction of laser beam travel relative to a substrate) for a symmetrical spatial profile. To generate the top hat beam spatial profile 100, conventional diffractive optical elements and shaping techniques may be applied to truncate power in the tails in regions below $x_0$ and above $x_1$ for a TM mode laser source having a substantially Gaussian profile so that there is effectively a uniform energy density.

Figure 1B:
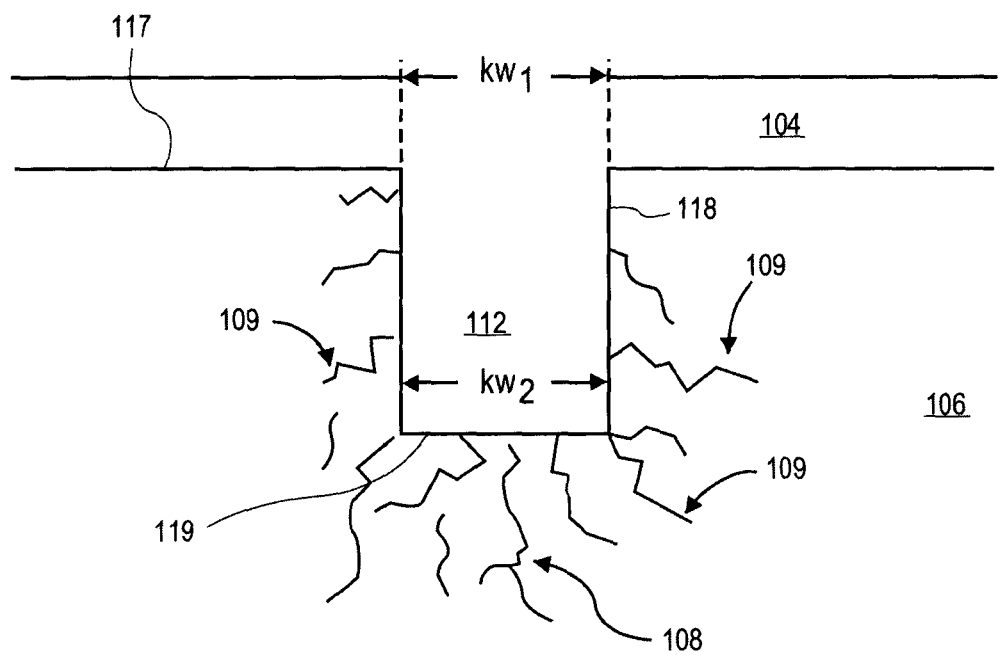
FIG. 1B is a cross-sectional view of a trench ablated in a substrate with a laser beam having the spatial profile illustrated in FIG. 1A.

FIG. 1B is a cross-sectional view of a trench ablated in a substrate 106 with a laser beam having the spatial profile illustrated in FIG. 1A. As shown, the ablated trench 112 has a nominal kerf width $KW_1$ at a substrate top surface 117 which is a function of the beam width $W_1$. The uniform energy density of the laser beam profile 100 renders the kerf width $KW_1$ substantially constant with/independent of trench depth such that the trench bottom 119 also has an effective nominal kerf width of $KW_1$. It has been found that ablating the trench 112 also generates a number of microcracks in the substrate 106 (e.g., single crystalline silicon substrate) below the trench bottom 119 and emanating from the trench sidewalls. Though not bound by theory, it is currently thought such microcrack formation results from substrate heating during the ablation process. As shown in FIG. 1B, microcracks may be further classified as vertically propagating cracks 108 or laterally propagating cracks 109. Vertically propagating cracks 108 tend to emanate from the trench bottom 119 in a direction substantially parallel with the trench sidewalls 118 while horizontally propagating cracks 109 emanate from the sidewalls 118 or trench bottom 119 in a direction non-parallel with the trench sidewalls 118. For the hybrid scribing methods described herein, where a plasma etch subsequent to the laser ablation of trench 112 will advance the trench bottom 119 through the substrate with anisotropic etch, the vertically propagating cracks 108 will be eliminated. Horizontally propagating cracks 109 however pose a risk of surviving an anisotropic etch process which does not significantly etch the trench sidewall 118. Because the trench 112 may be just below a device thin film layer 104, horizontally propagating cracks 109 which survive the singulation process pose a risk of continuing to run out laterally (non-parallel to the sidewall 118) and adversely affect product die adjacent to the trench 112.

Figure 2A:
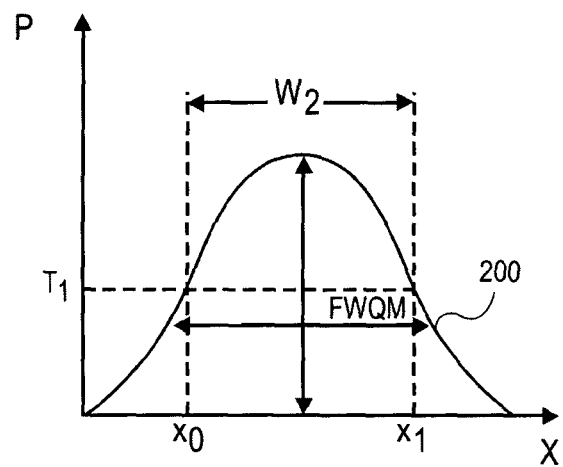
FIG. 2A is a graph illustrating a laser beam with a centrally peaked spatial profile, in accordance with an embodiment of the present invention.

While it has been found by the inventor and his associates that a femtosecond laser advantageously reduces the occurrence of all microcracks in the substrate, the inventor has further found that of the fewer remaining microcracks the ratio of vertically oriented microcracks to horizontally oriented microcracks can be increased significantly when a centrally peaked spatial power profile is employed FIG. 2A is a graph illustrating the femtosecond laser beam has a centrally peaked spatial profile rather than the top-hat profile 100. It should be noted that this phenomena has been found in testing performed with a femtosecond laser, and therefore although it is currently thought that the effect may be generalized to lasers of greater pulse widths (e.g., picosecond lasers), this remains unconfirmed.

FIG. 2A is a graph illustrating a laser beam with a centrally peaked spatial profile 200, in accordance with an embodiment of the present invention. The centrally peaked spatial profile 200 provides a varying power level (P) across a beam width $W_2$ (as measured in a manner consistent with that for $W_1$) along at least the direction x, which is in a direction substantially perpendicular to a direction of laser beam travel relative to the substrate. The centrally peaked spatial profile 200 may further be the same in the direction y (direction of laser beam travel relative to a substrate) for a symmetrical spatial profile. Generally, the laser beam profile may be any which has a non-uniform energy density with a peak power approximately centered within the beam width $W_2$ (i.e., approximately centered between $x_0$ and $x_1$). In one embodiment, the centrally peaked spatial profile 200 is a Gaussian profile, for example of a TM mode source. In a further embodiment, the centrally peaked spatial profile 200 is nearly a Gaussian profile with the profile function deviating by no more than 10% from the Gaussian function at any point along the x-axis across the beam width $W_2$ (e.g., between $x_0$ and $x_1$). In alternative embodiments, conventional diffractive optical elements and shaping techniques may be applied to modulate the slope of laser power from a TM mode laser source as a function of x between $x_0$ and above $x_1$ to increase or decrease a delta between a peak power $P((x_1-x_0)/2)$ relative to power at the beam edge P(x0); P(x1) relative to a Gaussian profile.

Figure 2B:
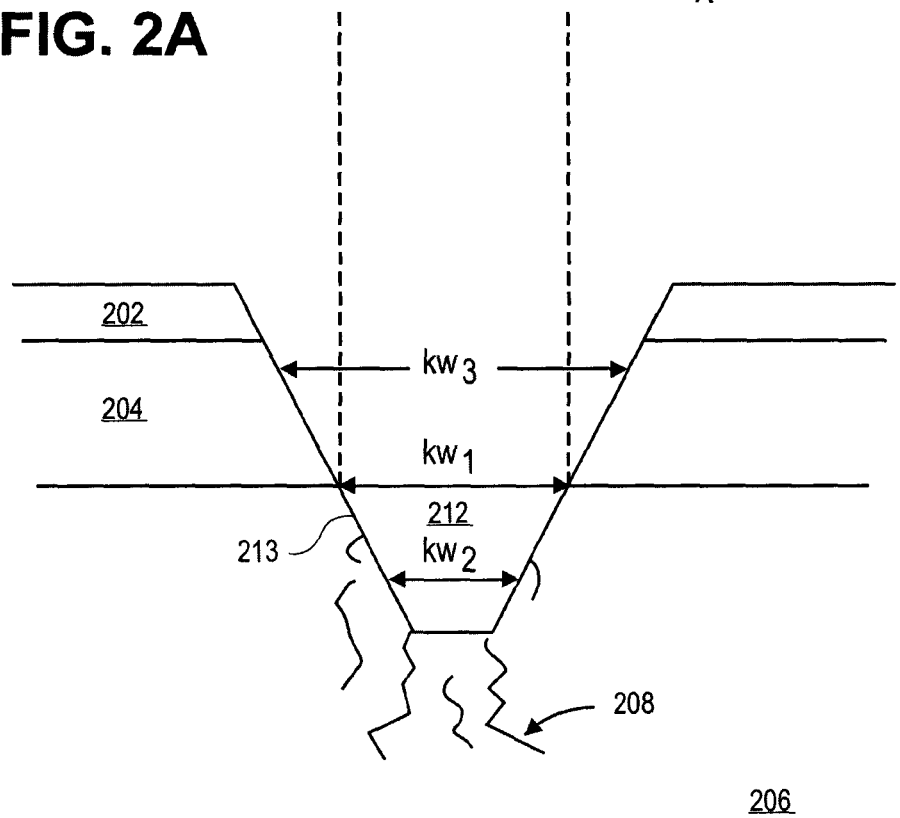
FIG. 2B is a cross-sectional view of a trench ablated in a substrate with a laser beam having the spatial profile illustrated in FIG. 2A, in accordance with an embodiment of the present invention.

FIG. 2B is a cross-sectional view of a trench ablated in a substrate with a laser beam having the non-uniform spatial profile illustrated in FIG. 2A, in accordance with an embodiment of the present invention. As shown, the ablated trench has a substrate sidewall 213 with a positive slope. More specifically, at a region adjacent to an interface between a substrate 206 and an overlying thin film device layer 204, the laser ablated trench 212 has a first kerf width $KW_1$ while at a region below the interface, the ablated trench 212 has a second kerf width $KW_2$ which is smaller than the first kerf width $KW_1$. The second kerf width KW2 may be measured anywhere below a top surface of the substrate 206 or interface with the thin film device layer 204 (i.e., just below the surface or at the bottom of the ablated trench). In one such embodiment, the second kerf width $KW_2$ is less than 75% of the first kerf width $KW_1$. In another embodiment, the second kerf width $KW_2$ is less than 50% of the first kerf width $KW_1$.

In embodiments, the laser beam spatial profile is such that the power (P) at the peak of the spatial power profile is sufficient to expose the substrate and the power at the full width quarter maximum (FWQM) is insufficient to expose the substrate. As further shown in FIG. 2A, the FWQM line is below a threshold power $T_1$ required to ablated through the mask 202 thickness and thin film device stack 204 thickness to expose the substrate 206. As such, the first kerf width $KW_1$ is a function of the beam width $W_2$ exceeding that threshold power $T_1$ with regions outside of $W_2$ ablating less than the entire thickness of the mask 202 and thin film device stack 204. In the exemplary embodiment having a Gaussian profile which extends beyond $W_2$, the sidewalls of both the thin film device stack 204 and mask 202 are also positively sloped such that the ablated trench 212 has a third kerf width $KW_3$ in a region adjacent to the mask 202 that is larger than the first kerf width $KW_1$. For alternative embodiments, the positive slope of the mask 202 and/or thin film device stack 204 is reduced or made substantially vertical by truncating the tails of the centrally peaked profile 200 beyond $x_0$ and $x_1$ using known techniques.

Figure 2C:
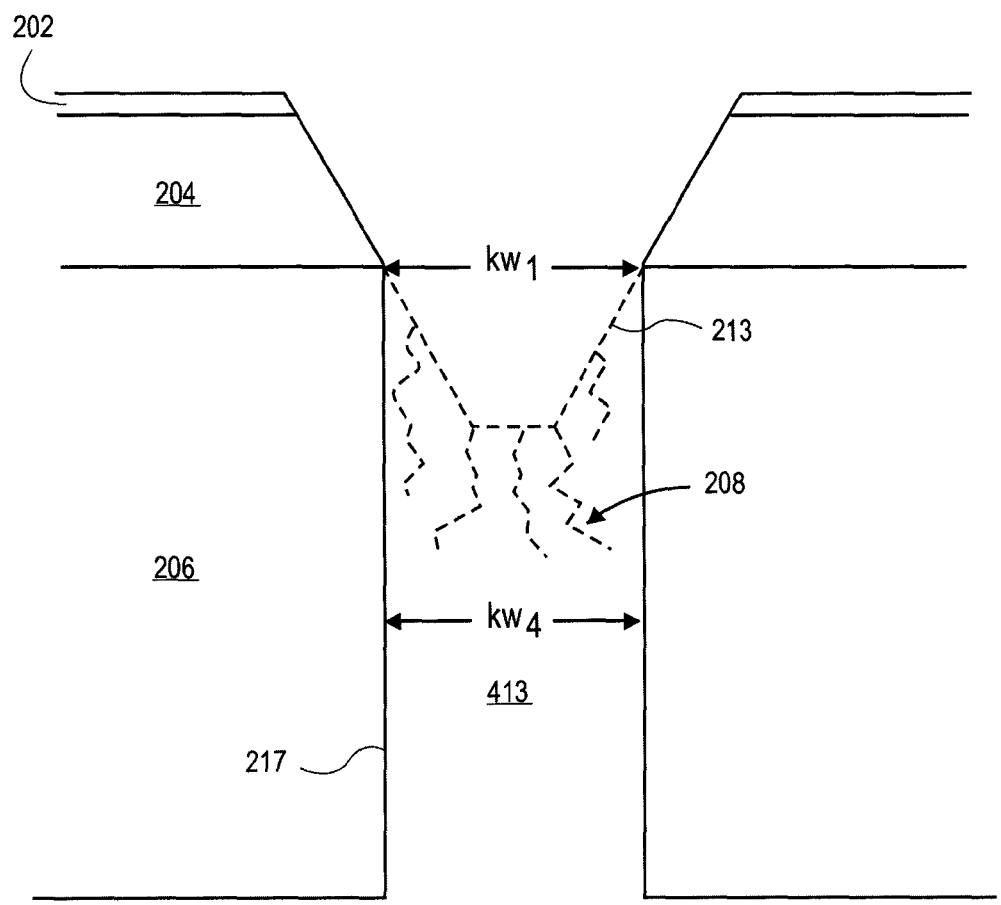
FIG. 2C is a cross-sectional view of an anisotropically etched trench in a substrate which had been ablated by a laser beam having the spatial profile illustrated in FIG. 2A.

For certain beam embodiments employing the centrally peaked spatial profile 200, and more particularly those of a femtosecond laser, a greater percentage of microcracks generated in the substrate 208 may be vertically propagating microcracks 208 and as further illustrated in FIGS. 2B and 2C, the positive slope of the sidewall 213 also leaves more of the substrate material lining the ablated trench 212 (which may have microcracks) exposed to the subsequent plasma etch so that microcracks (vertically propagating or otherwise) may be removed as part of the singulation process.

FIG. 2C is a cross-sectional view of an anisotropically etched trench 413 in the substrate 206 which had been ablated by a laser beam having the spatial profile illustrated in FIG. 2A. For example, as illustrated in FIG. 2C by dashed lines, microcracks (e.g., vertically oriented microcracks 208) are consumed as the etch front passes through the thickness of the substrate 206. In the exemplary embodiment where the etched trench has a further kerf width $KW_4$, the sloped ablated trench sidewalls 213 are consumed as the etch front generates substantially vertical sidewalls 217 extending through the substrate 206. For the exemplary embodiment where the thin film device stack 204 masks the plasma etch process responsible for the etched trench 213, the etched trench 213 has a fourth kerf width $KW_4$ which is approximately equal (i.e., +/−10%) to the first kerf width $KW_1$ and therefore greater than the second kerf width $KW_2$.

Figure 3A:
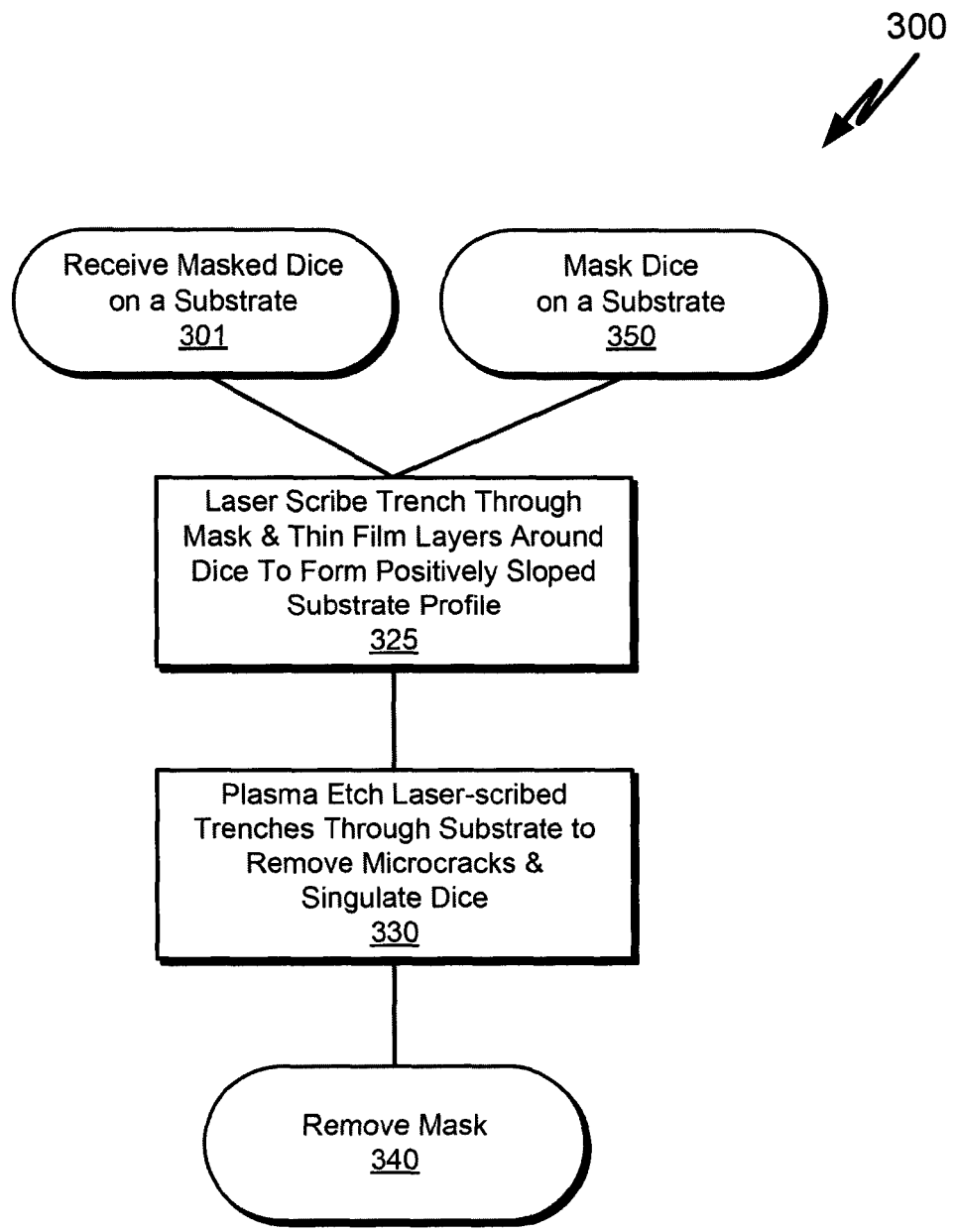
FIG. 3A is a flow diagram of a hybrid laser scribing plasma etch dicing process, in accordance with an embodiment of the present invention.

FIG. 3A is a flow diagram illustrating a hybrid laser ablation-plasma etch singulation method 300 employing iterative laser scribing, in accordance with an embodiment of the present invention. FIGS. 4A-4D illustrate cross-sectional views of a substrate 406 including first and second ICs 425, 426 corresponding to the operations in method 300, in accordance with an embodiment of the present invention.

Figure 4A:
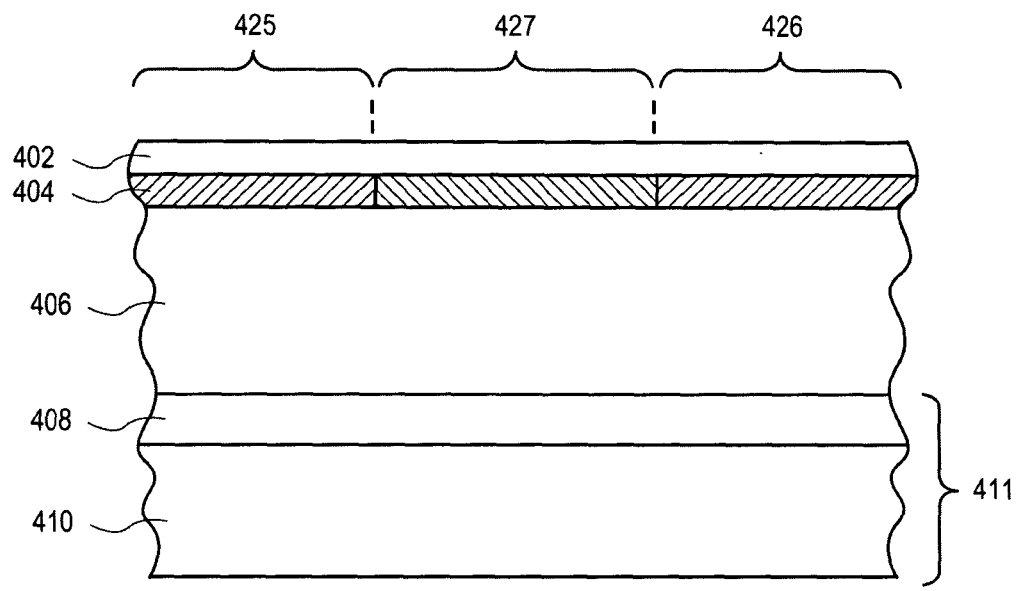
FIG. 4A illustrates a cross-sectional view of a substrate including a plurality of ICs corresponding to operation 301 of the dicing method illustrated in FIG. 3, in accordance with an embodiment of the present invention.
Figure 4B:
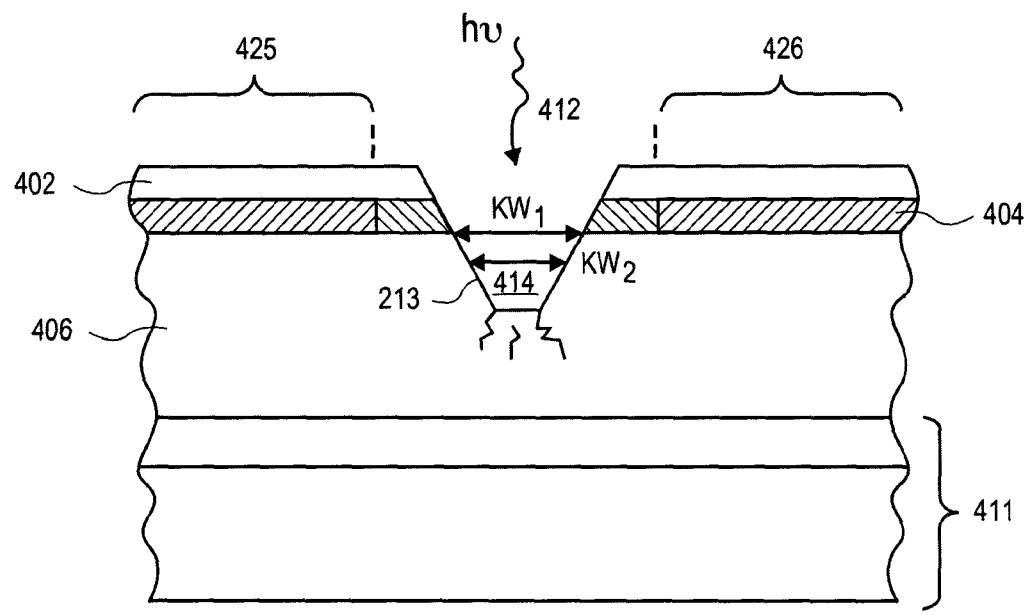
FIG. 4B illustrates a cross-sectional view of a substrate including a plurality of ICs corresponding to operation 325 of the dicing method illustrated in FIG. 1, in accordance with an embodiment of the present invention.
Figure 4C:
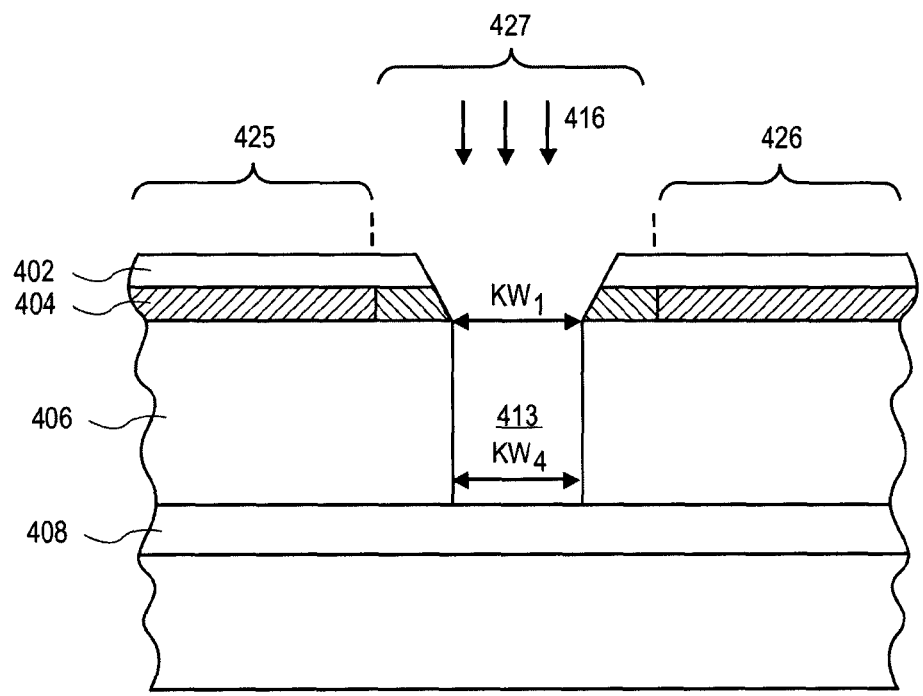
FIG. 4C illustrates a cross-sectional view of a substrate including a plurality of ICs corresponding to operation 330 of the dicing method illustrated in FIG. 1, in accordance with an embodiment of the present invention.

Referring to operation 301 of FIG. 1, and corresponding FIG. 4A, a substrate 406 is received. The substrate 406 includes a mask 402 covering a thin film device layer stack 401 comprising a plurality of distinct materials found both in the ICs 425, 426 and intervening street 427 between the ICs 425, 426. Generally, the substrate 406 is composed of any material suitable to withstand a fabrication process of the thin film device layers formed thereon. For example, in one embodiment, substrate 406 is a group IV-based material such as, but not limited to, monocrystalline silicon, germanium or silicon/germanium. In another embodiment, substrate 406 is a III-V material such as, e.g., a III-V material substrate used in the fabrication of light emitting diodes (LEDs). During device fabrication, the substrate 406 is typically 600 μm-800 μm thick, but as illustrated in FIG. 4A may have been thinned to less than 100 µm and sometimes less than 50 µm with the thinned substrate now supported by a carrier 411, such as a backing tape 410 stretched across a support structure of a dicing frame (not illustrated) and adhered to a backside of the substrate with a die attach film (DAF) 408.

In embodiments, first and second ICs 425, 426 include memory devices or complimentary metal-oxide-semiconductor (CMOS) transistors fabricated in a silicon substrate 406 and encased in a dielectric stack. A plurality of metal interconnects may be formed above the devices or transistors, and in surrounding dielectric layers, and may be used to electrically couple the devices or transistors to form the ICs 425, 426. Materials making up the street 427 may be similar to or the same as those materials used to form the ICs 425, 426. For example, street 427 may include thin film layers of dielectric materials, semiconductor materials, and metallization. In one embodiment, the street 427 includes a test device similar to the ICs 425, 426. The width of the street 427 may be anywhere between 10 µm and 200 µm, measured at the thin film device layer stack/substrate interface.

In embodiments, the mask 402 may be one or more material layers including any of a plasma deposited polymer (e.g., $C_xF_y$), a water soluble material (e.g., poly(vinyl alcohol)), a photoresist, or similar polymeric material which may be removed without damage to an underlying passivation layer, which is often polyimide (PI) and/or bumps, which are often copper. The mask 402 is to be of sufficient thickness to survive a plasma etch process (though it may be very nearly consumed) and thereby protect the copper bumps which may be damaged, oxidized, or otherwise contaminated if exposed to the substrate etching plasma.

Figure 5:
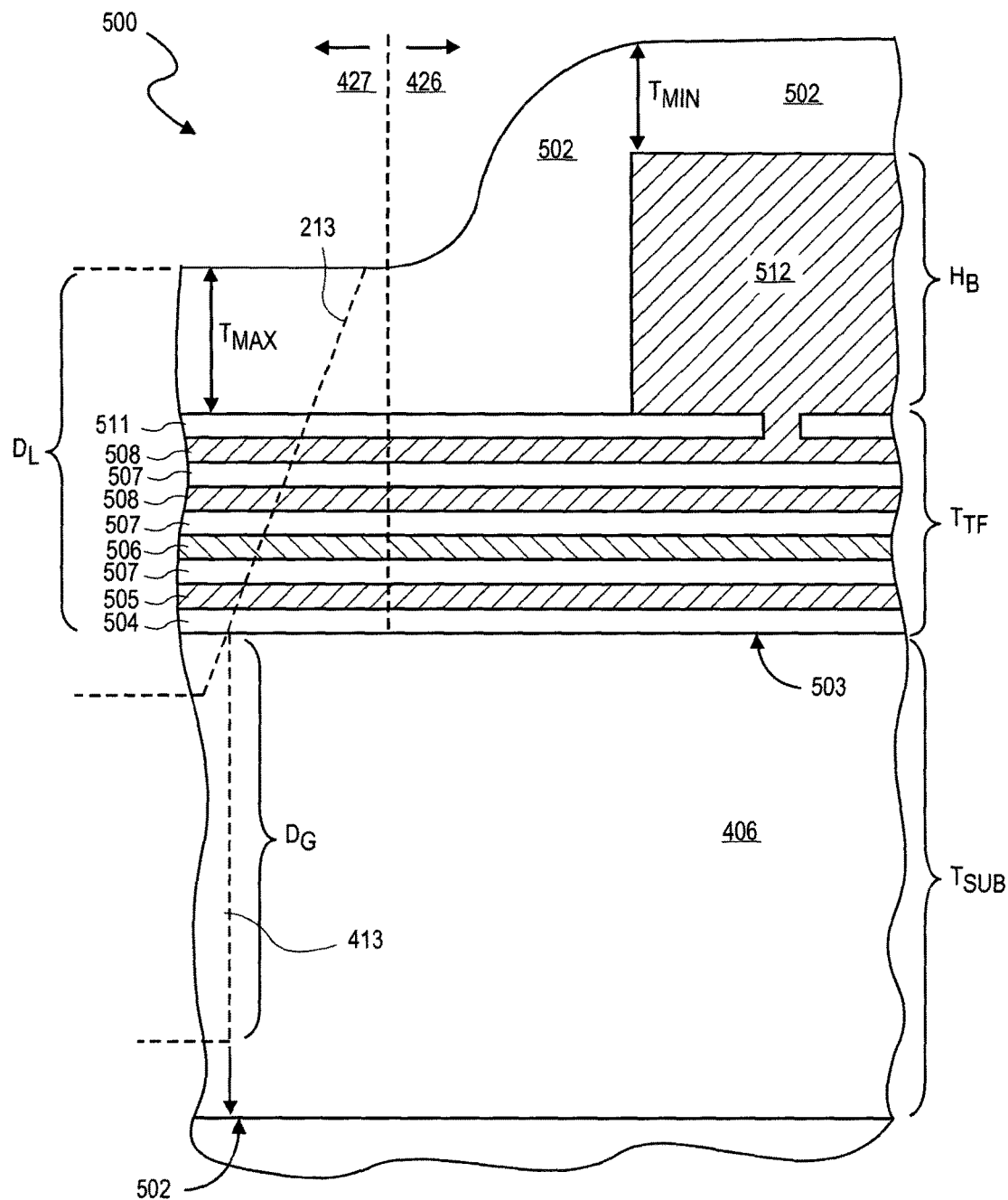
FIG. 5 illustrates an expanded cross-sectional view of an mask and thin film device layer stack ablated by a laser and plasma etched, in accordance with embodiments of the present invention.

FIG. 5 illustrates an expanded cross-sectional view 500 of a bi-layer mask including a mask layer 402B (e.g., $C_xF_y$ polymer) applied over a mask layer 402A (e.g., a water soluble material) in contact with a top surface of the IC 426 and the street 427, in accordance with embodiments of the present invention. As shown in FIG. 5, the substrate 406 has a top surface 503 upon which thin film device layers are disposed which is opposite a bottom surface 502 which interfaces with the DAF 408 (FIG. 4A). Generally, the thin film device layer materials may include, but are not limited to, organic materials (e.g., polymers), metals, or inorganic dielectrics such as silicon dioxide and silicon nitride. The exemplary thin film device layers illustrated in FIG. 5 include a silicon dioxide layer 504, a silicon nitride layer 505, copper interconnect layers 508 with low-κ (e.g., less than 3.5) or ultra low-κ (e.g., less than 3.0) interlayer dielectric layers (ILD) such as carbon doped oxide (CDO) disposed there between. A top surface of the IC 426 includes a bump 512, typically copper, surrounded by a passivation layer 511, typically a polyimide (PI) or similar polymer. The bump 512 and passivation layer 511 therefore make up a top surface of the IC with the thin film device layers forming subsurface IC layers. The bump 512 extends from a top surface of the passivation layer 511 by a bump height $H_B$ which in the exemplary embodiments ranges between 10 µm and 50 µm. One or more layers of the mask may not completely cover a top surface of the bump 512, as long as at least one mask layer is covering the bump 512 for protection during substrate plasma etch.

Figure 3B:
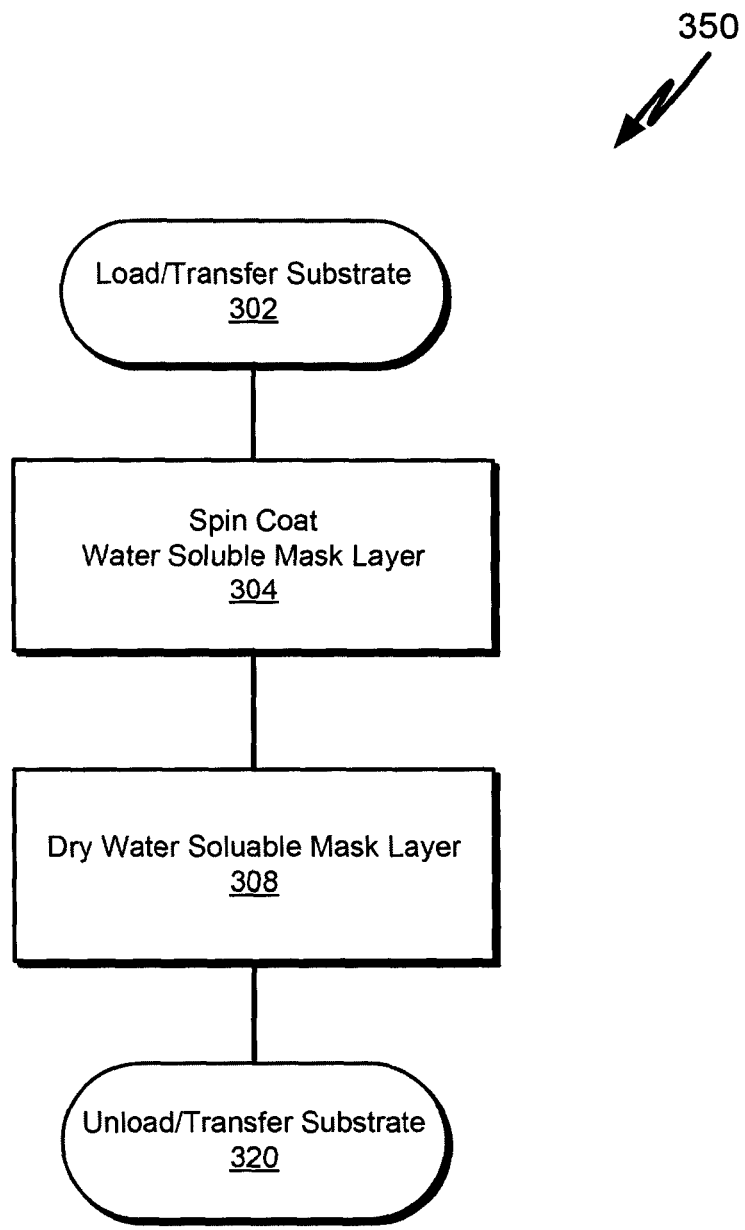
FIG. 3B is a flow diagram of a mask application method which may be practiced as part of the hybrid laser scribing plasma etch dicing process illustrated in FIG. 3A, in accordance with an embodiment of the present invention.

Referring back to FIG. 3A, in certain embodiments the mask 402 may be applied as part of the method 300, for example where an integrated processing platform includes a module for applying the mask 402. FIG. 3B is a flow diagram of one exemplary mask application method 350 which may be practiced as part of the hybrid laser scribing plasma etch dicing process illustrated in FIG. 3A, in accordance with an embodiment of the present invention. At operation 302, a substrate is loaded onto a spin coat system or transferred into a spin coat module of an integrated platform. At operation 304 an aqueous solution of a water soluble polymer is spun over the passivation layer 511 and bump 512 (FIG. 5). Experiments conducted with PVA solutions showed a non-planarized coverage of 50 µm bumps a $T_{min}$ greater than 5 µm and a $T_{max}$ at the street less than 20 µm.

At operation 308 the aqueous solution is dried, for example on a hot plate, and the substrate unloaded for laser scribe or transferred in vacuum to a laser scribe module at operation 320 for completion of the method 300 (FIG. 3A). For particular embodiments where the water soluble layer is hygroscopic, vacuum transfer is particularly advantageous. The spin and dispense parameters are a matter of choice depending on the material, substrate topography and desired layer thickness. The drying temperature and time should be selected to provide adequate etch resistance while avoiding excessive crosslinking which renders removal difficult. Exemplary drying temperatures range from 60° C. to 150° C. depending on the material. For example, PVA was found to remain soluble at 60° C. while becoming more insoluble as the temperature approached the 150° C. limit of the range.

Returning to FIG. 3A, at operation 325 a predetermined pattern is directly written into the mask 402 with ablation along a controlled path relative to the substrate 406. As illustrated in corresponding FIG. 4B, the mask 402 is patterned by laser radiation 411 having a centrally peak spatial profile to form the trench 414 extending through the mask thickness and through the thin film device layer stack 404 to expose the substrate 406. The ablated trench 414 has the positively sloped sidewalls such that a portion of the trench adjacent to the top surface of the substrate 406 has a first kerf width $KW_1$ and the bottom of the trench extending below the top surface of the substrate 406 has a second kerf width $KW_2$, as previously described herein.

In an embodiment the laser radiation 412 entails beam with a pulse width (duration) in the femtosecond range (i.e., $10^{-15}$ seconds). Laser parameter selection, such as pulse width, may be critical to developing a successful laser scribing and dicing process that minimizes chipping, microcracks and delamination in order to achieve clean laser scribe cuts. As previously noted, laser pulse width in the femtosecond range advantageously mitigates heat damage issues relative longer pulse widths (e.g., picosecond or nanosecond). Although not bound by theory, as currently understood a femtosecond energy source avoids low energy recoupling mechanisms present for picosecond sources and provides for greater thermal nonequilibrium than does a nanosecond or even picosecond source. With nanosecond or picoseconds laser sources, the various thin film device layer materials present in the street 427 behave quite differently in terms of optical absorption and ablation mechanisms. For example, dielectrics layers such as silicon dioxide, is essentially transparent to all commercially available laser wavelengths under normal conditions. By contrast, metals, organics (e.g., low-κ materials) and silicon can couple photons very easily, particularly nanosecond-based or picosecond-based laser irradiation. If non-optimal laser parameters are selected, in a stacked structures that involve two or more of an inorganic dielectric, an organic dielectric, a semiconductor, or a metal, laser irradiation of the street 427 may disadvantageously cause delamination. For example, a laser penetrating through high bandgap energy dielectrics (such as silicon dioxide with an approximately of 9 eV bandgap) without measurable absorption may be absorbed in an underlying metal or silicon layer, causing significant vaporization of the metal or silicon layers. The vaporization may generate high pressures potentially causing severe interlayer delamination and microcracking. Femtosecond-based laser irradiation processes have been demonstrated to avoid or mitigate such microcracking or delamination of such material stacks.

In an embodiment, the laser source for operation 325 has a pulse repetition rate approximately in the range of 200 kHz to 10 MHz, although preferably approximately in the range of 500 kHz to 5 MHz. The laser emission generated at operation 201 may span any combination of the visible spectrum, the ultra-violet (UV), and/or infra-red (IR) spectrums for a broad or narrow band optical emission spectrum. Even for femtosecond laser ablation, certain wavelengths may provide better performance than others depending on the materials to be ablated. In a specific embodiment, a femtosecond laser suitable for semiconductor substrate or substrate scribing is based on a laser having a wavelength of approximately between 1570-200 nanometers, although preferably in the range of 540 nanometers to 250 nanometers. In a particular embodiment, pulse widths are less than or equal to 500 femtoseconds for a laser having a wavelength less than or equal to 540 nanometers. In an alternative embodiments, dual laser wavelengths (e.g., a combination of an IR laser and a UV laser) are used to generate the beam at operation 201. In an embodiment, the laser source delivers pulse energy at the work surface approximately in the range of 0.5 µJ to 100 µJ, although preferably approximately in the range of 1 µJ to 5 µJ.

At operation 325, the spatially peaked beam is controlled to travel a predetermined path relative to the substrate to ablate a point on the mask 402. In an embodiment, the laser scribing process runs along a work piece surface in the direction of travel at a speed approximately in the range of 500 mm/sec to 5 m/sec, although preferably approximately in the range of 600 mm/sec to 2 m/sec. At operation 220, method 200 returns to FIG. 1 for plasma etch of the exposed substrate.

Figure 4D:
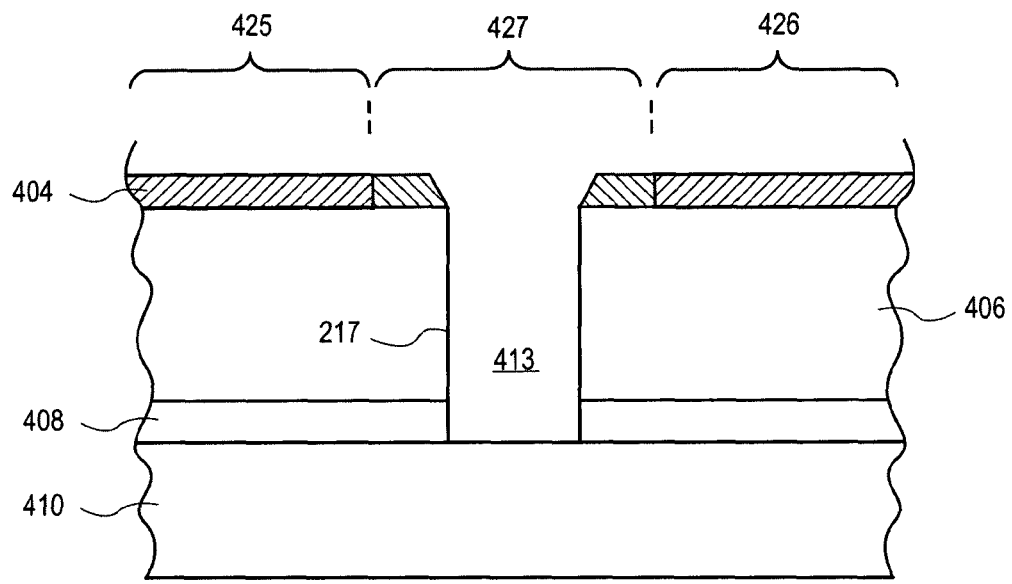
FIG. 4D illustrates a cross-sectional view of a semiconductor substrate including a plurality of ICs corresponding to operation 340 of the dicing method illustrated in FIG. 1, in accordance with an embodiment of the present invention.

Returning to FIGS. 3A and 4D, the substrate 406 is exposed to a plasma 416 to etch through the ablated trench 414 to singulate the ICs 426 at operation 330. In the exemplary embodiment. In accordance with an embodiment of the present invention, etching the substrate 406 at operation 330 includes anisotropically advancing the trench 414 formed with the laser scribing process entirely through substrate 406, as depicted in FIG. 4D. A high-density plasma source operating at high powers may be used for the plasma etching operation 330. Exemplary powers range between 3 kW and 6 kW, or more. High powers provide advantageously high etch rates. For example, in a specific embodiment, the etch rate of the material of substrate 406 is greater than 25 µms per minute.

In one embodiment, a deep silicon etch (e.g., such as a through silicon via etch) is used to etch a single crystalline silicon substrate or substrate 406 at an etch rate greater than approximately 40% of conventional silicon etch rates while maintaining essentially precise profile control and virtually scallop-free sidewalls. Effects of the high power on any water soluble material layer present in the mask 402 are controlled through application of cooling power via an electrostatic chuck (ESC) chilled to −10° C. to −15° C. to maintain the water soluble mask material layer at a temperature below 100° C. and preferably between 70° C. and 80° C. throughout the duration of the plasma etch process. At such temperatures, water solubility is advantageously maintained.

In a specific embodiment, the plasma etch operation 330 further entails a plurality of protective polymer deposition cycles interleaved over time with a plurality of etch cycles. The duty cycle may vary with the exemplary duty cycle being approximately 1:1-1:2 (etch:dep). For example, the etch process may have a deposition cycle with a duration of 250 msec-750 msec and an etch cycle of 250 msec-750 msec. Between the deposition and etch cycles, an etching process chemistry, employing for example $SF_6$ for the exemplary silicon etch embodiment, is alternated with a deposition process chemistry employing a polymerizing fluorocarbon ($CH_xF_y$) gas such as, but not limited to, $C_4F_6$ or $C_4F_8$ or fluorinated hydrocarbon ($CH_xF_y$ with x>=1), or $XeF_2$. Process pressures may further be alternated between etch and deposition cycles to favor each in the particular cycle, as known in the art.

At operation 340, method 300 is completed with removal of the mask 402. In an embodiment, a water soluble mask layer is washed off with water, for example with a pressurized jet of de-ionized water or through submergence in an ambient or heated water bath. In alternative embodiments, the mask 402 may be washed off with aqueous solvent solutions known in the art to be effective for etch polymer removal. Either of the plasma singulation operation 330 or mask removal process at operation 340 may further pattern the die attach film 408, exposing the top portion of the backing tape 410.

Figure 6A:
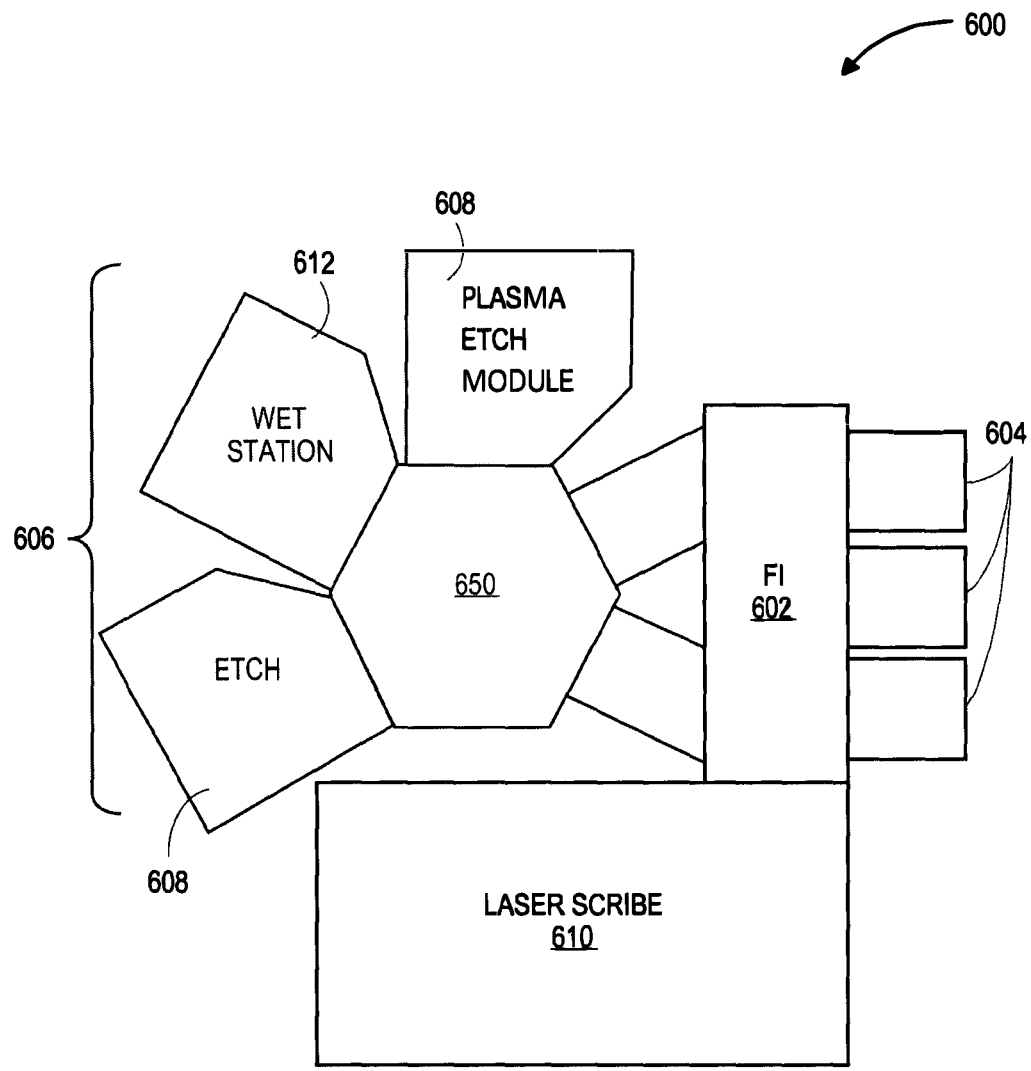
FIG. 6A illustrates a block diagram of an integrated platform layout for laser and plasma dicing of substrates, in accordance with an embodiment of the present invention.

A single integrated process tool 600 may be configured to perform many or all of the operations in the hybrid laser ablation-plasma etch singulation process 300. For example, FIG. 6A illustrates a block diagram of a cluster tool 606 coupled with laser scribe apparatus 610 for laser and plasma dicing of substrates, in accordance with an embodiment of the present invention. Referring to FIG. 6A, the cluster tool 606 is coupled to a factory interface 602 (FI) having a plurality of load locks 604. The factory interface 602 may be a suitable atmospheric port to interface between an outside manufacturing facility with laser scribe apparatus 610 and cluster tool 606. The factory interface 602 may include robots with arms or blades for transferring substrates (or carriers thereof) from storage units (such as front opening unified pods) into either cluster tool 606 or laser scribe apparatus 610, or both.

Figure 6B:
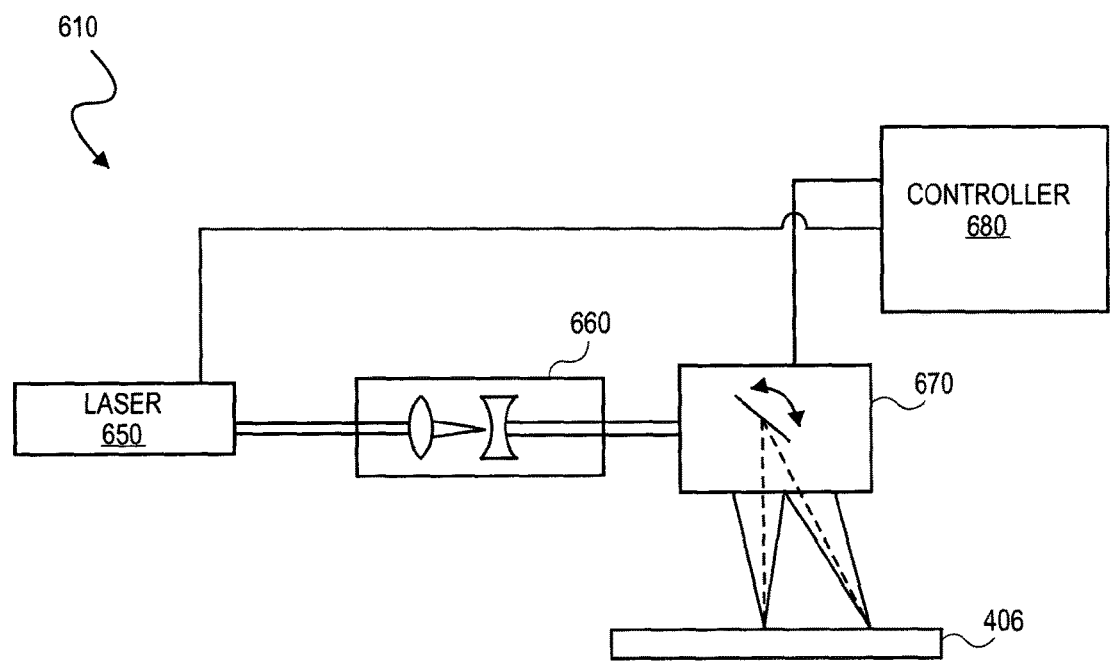
FIG. 6B illustrates a block diagram of a laser scribing module for laser scribing, in accordance with an embodiment of the present invention.

A laser scribe apparatus 610 is also coupled to the FI 602. FIG. 6B illustrates an exemplary functional block diagram of the laser scribe apparatus 610. In an embodiment illustrated in FIG. 6B, the laser scribe apparatus 610 includes a laser 665, which may be a femtosecond laser as described elsewhere herein. The laser 665 is to performing the laser ablation portion of the hybrid laser and etch singulation process 300. In one embodiment, a moveable stage 406 is also included in laser scribe apparatus 610, the moveable stage 406 configured for moving a substrate or substrate (or a carrier thereof) relative to the femtosecond-based laser. As further illustrated, the laser scribe apparatus includes a scanner 670 (i.e., galvanometer) with a mirror movable to scan the laser beam in response to control signals from the controller 680. Depending on the implementation, the laser 665 either provides a centrally peak beam profile (e.g., Gaussian) as described elsewhere herein or between the femtosecond laser 665 and scanner 670 are beam shaping optics 660 which are to provide the centrally peaked beam profile substantially as shown in FIG. 2A.

Returning to FIG. 6A, the cluster tool 606 includes one or more plasma etch chambers 608 coupled to the FI by a robotic transfer chamber 650 housing a robotic arm for vacuum transfer of substrates between the laser scribe module 610, etch chamber(s) 608 and/or mask module 614. The plasma etch chambers 608 is suitable for at least the plasma etch portion of the hybrid laser and etch singulation process 100 and may further deposit a polymer mask over the substrate. In one exemplary embodiment, the plasma etch chamber 608 is further coupled to an $SF_6$ gas source and at least one of a $C_4F_8$, $C_4F_6$, or $CH_2F_2$ source. In a specific embodiment, the one or more plasma etch chambers 608 is an Applied Centura® Silvia®. Etch system, available from Applied Materials of Sunnyvale, Calif., USA, although other suitable etch systems are also available commercially. The Applied Centura® Silvia®. Etch system provides capacitive and inductive RF coupling for independent control of the ion density and ion energy than possible with capacitive coupling only, even with the improvements provided by magnetic enhancement. This enables one to effectively decouple the ion density from ion energy, so as to achieve relatively high density plasmas without the high, potentially damaging, DC bias levels, even at very low pressures (e.g., 5-10 mTorr). This results in an exceptionally wide process window. However, any plasma etch chamber capable of etching silicon may be used. In an embodiment, more than one plasma etch chamber 608 is included in the cluster tool 606 portion of integrated platform 600 to enable high manufacturing throughput of the singulation or dicing process.

The cluster tool 606 may include other chambers suitable for performing functions in the hybrid laser ablation-plasma etch singulation process 100. In the exemplary embodiment illustrated in FIG. 6, a mask module 614 includes any commercially available spin coating module for application of the water soluble mask layer described herein. The spin coating module may include a rotatable chuck adapted to clamp by vacuum, or otherwise, a thinned substrate mounted on a carrier such as backing tape mounted on a frame.

Figure 7:
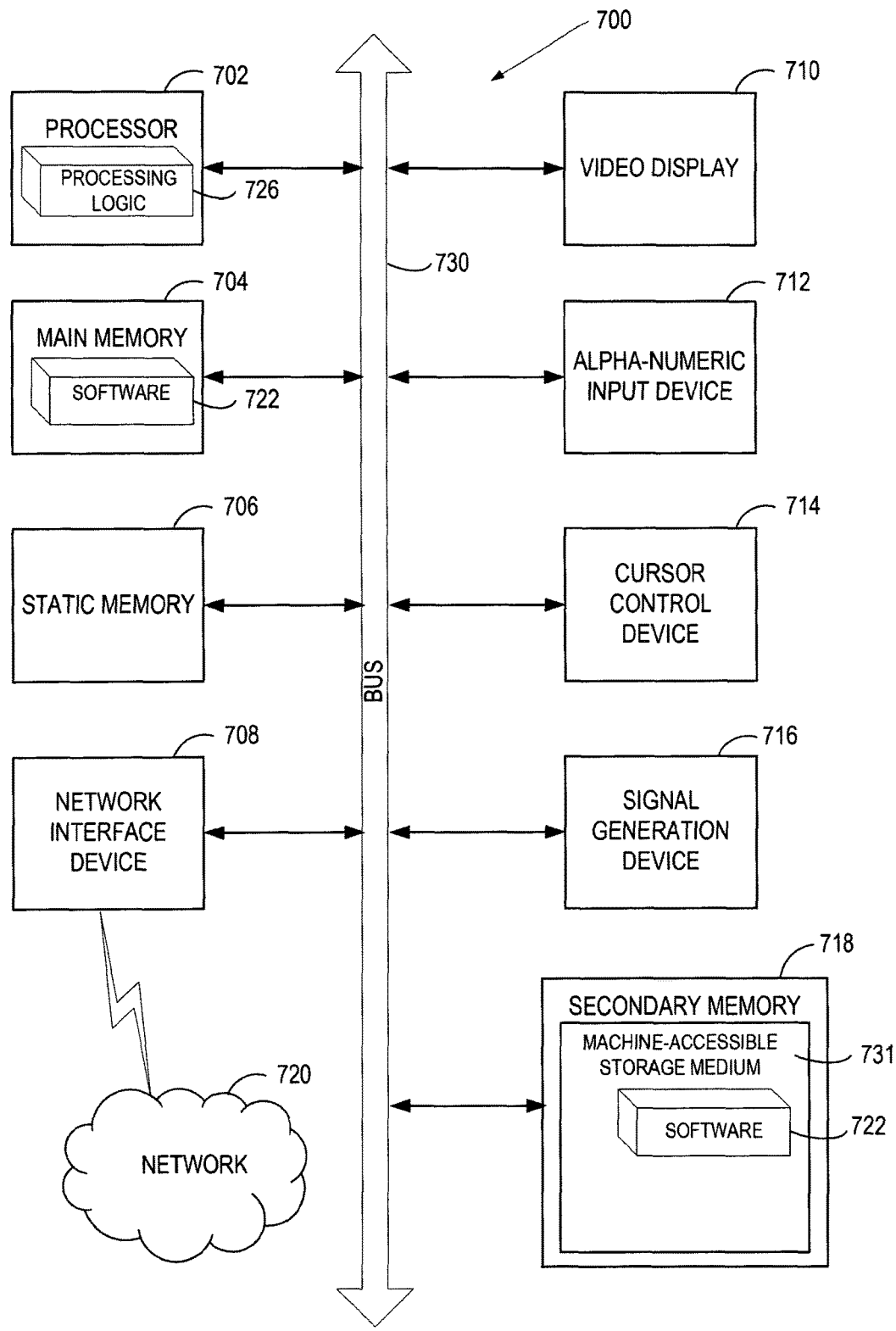
FIG. 7 illustrates a block diagram of an exemplary computer system which controls automated performance of one or more operation in the laser scribing methods described herein, in accordance with an embodiment of the present invention.

FIG. 7 illustrates a computer system 700 within which a set of instructions, for causing the machine to execute one or more of the scribing methods discussed herein may be executed. The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, etc. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations and steps discussed herein.

The computer system 700 may further include a network interface device 708. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 731 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

The machine-accessible storage medium 731 may also be used to store pattern recognition algorithms, artifact shape data, artifact positional data, or particle sparkle data. While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Thus, methods of dicing semiconductor substrates, each substrate having a plurality of ICs, have been disclosed. The above description of illustrative embodiments of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The scope of the invention is therefore to be determined entirely by the following claims, which are to be construed in accordance with established doctrines of claim interpretation.

What is claimed is:

1. A system for dicing a semiconductor substrate comprising a plurality of integrated circuits (ICs), the system comprising:

a laser scribe module to pattern a mask and expose regions of a substrate between the ICs along a predetermined path, the laser scribe module to ablate a predetermined pattern of trenches into the mask, into a thin film IC stack disposed below the mask, and expose a substrate disposed below the thin film IC stack, wherein the laser scribe module comprises a laser having a beam with a centrally peaked spatial power profile and a stage for supporting the semiconductor substrate during laser scribing by the beam; and a plasma etch chamber physically coupled to the laser scribe module by a common factory interface, the plasma etch chamber configured to singulate the ICs, wherein the common factory interface comprises a load lock, an atmospheric port, and a robot for transferring the semiconductor substrate between the plasma etch chamber and the laser scribe module.

2. The system of claim 1, wherein the laser has a wavelength less than or equal to 540 nanometers and a pulse width of less than or equal to 500 femtoseconds.

3. The system of claim 2, wherein the centrally peaked spatial power profile comprises a Gaussian or near-Gaussian profile.

4. The system of claim 3, wherein the power at the peak of the spatial power profile is sufficient to expose the substrate and the power at the full width quarter maximum (FWQM) is insufficient to expose the substrate.

5. The system of claim 4, wherein the plasma etch chamber is to alternate over time between a polymer deposition cycle and an etch cycle, and wherein the plasma etch chamber is coupled to a polymer source gas including at least one of $C_4F_8$ and $C_4F_6$ and further coupled to an etch source gas including at least $SF_6$.

6. The system of claim 1, wherein the plasma etch chamber is included in a cluster tool, the cluster tool comprising a robotic transfer chamber and a load lock, wherein the plasma etch chamber is coupled to the robotic transfer chamber of the cluster tool.

7. The system of claim 6, wherein the robot of the common factory interface is for transferring the semiconductor substrate to the load lock of the cluster tool, and wherein the robotic transfer chamber of the cluster tool comprises a second robot for transferring the semiconductor substrate from the load lock of the cluster tool to the plasma etch chamber.

8. The system of claim 1, wherein the centrally peaked spatial power profile comprises a Gaussian or near-Gaussian profile.

9. The system of claim 1, wherein the power at the peak of the spatial power profile is sufficient to expose the substrate and the power at the full width quarter maximum (FWQM) is insufficient to expose the substrate.

10. The system of claim 1, wherein the plasma etch chamber is to alternate over time between a polymer deposition cycle and an etch cycle, and wherein the plasma etch chamber is coupled to a polymer source gas including at least one of $C_4F_8$ and $C_4F_6$ and further coupled to an etch source gas including at least $SF_6$.

11. The system of claim 1 further comprising a processor and a memory.

* * * * *